United States Patent [19]

Streit et al.

[11] Patent Number: 5,262,335
[45] Date of Patent: Nov. 16, 1993

[54] METHOD TO PRODUCE COMPLEMENTARY HETEROJUNCTION BIPOLAR TRANSISTORS

[75] Inventors: Dwight C. Streit, Long Beach; Aaron K. Oki, Torrance; Donald K. Umemoto, Manhattan Beach; James R. Velebir, Jr., Laguna Niguel, all of Calif.

[73] Assignee: TRW Inc., Redondo Beach, Calif.

[21] Appl. No.: 772,809

[22] Filed: Oct. 8, 1991

[51] Int. Cl.$^5$ .................... H01L 21/265; H01L 29/70
[52] U.S. Cl. ........................ 437/31; 437/34; 437/184; 148/DIG. 72
[58] Field of Search ..................... 437/34, 31; 148/72

[56] References Cited

U.S. PATENT DOCUMENTS 5,068,756 11/1991 Morris et al. ................ 357/16

OTHER PUBLICATIONS

David B. Slater, Jr. et al. "Monolithic Integration of Complementary HBT's by Selected MOVPE", IEEE Electron Device Letters, vol. 11, No. 4, Apr. 1990.

*Primary Examiner*—Olik Chaudhuri
*Assistant Examiner*—Long Pham
*Attorney, Agent, or Firm*—Ronald L. Taylor

[57] ABSTRACT

Disclosed is a method for fabricating complementary heterojunction bipolar transistors on a common substrate. The method comprises the steps of depositing a PNP profile by molecular beam epitaxy on an appropriate substrate and then depositing a layer of silicon nitride on the PNP profile just deposited. The substrate is then heated in a vacuum in order to densify the silicon nitride. A mask and resist layer are used to produce the desired PNP profile patterns. The NPN profile is deposited on the area of the substrate etched away as well as on the silicon nitride layer protecting the already deposited PNP layers. The NPN profile is then patterned using a resist and masking process. The polycrystalline NPN area on top of the silicon nitride layer and the remaining silicon nitride layer are etched away forming two adjacent complementary NPN and PNP profiles on a common substrate. In the fabrication of the heterojunction bipolar transistor circuits, the P-ohmic contacts on both the NPN and PNP materials is evaporated at the appropriate locations simultaneously. All of the N-ohmic contacts are also deposited simultaneously. By this, the complementary dual heterojunction bipolar transistor device can be effectively fabricated with excellent DC and microwave capabilities.

6 Claims, 4 Drawing Sheets

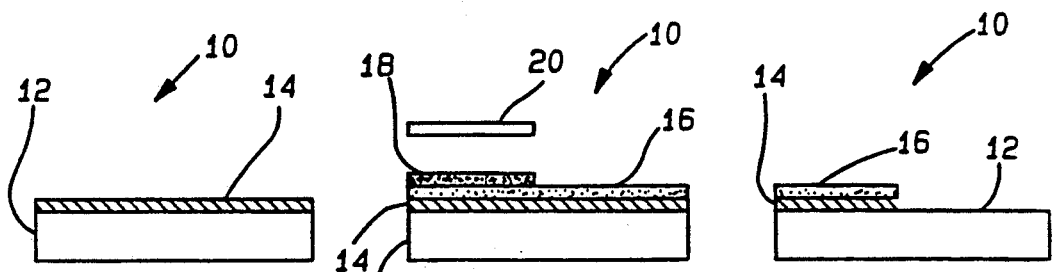
Fig-1A  Fig-1B  Fig-1C
Fig-1D  Fig-1E  Fig-1F
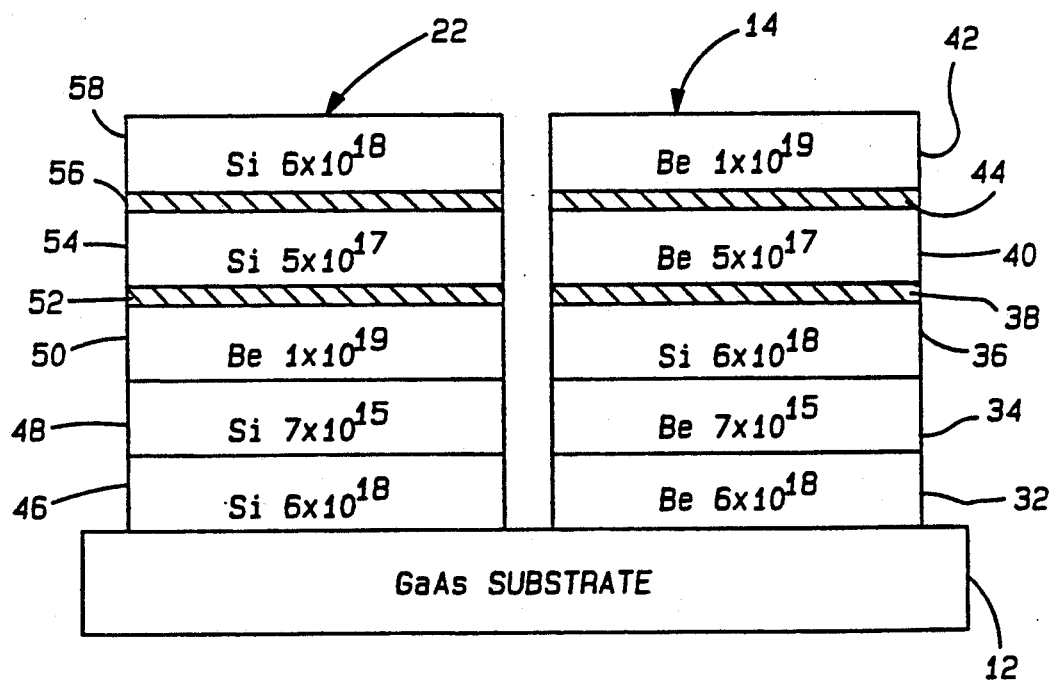
FIG-2

METHOD TO PRODUCE COMPLEMENTARY HETEROJUNCTION BIPOLAR TRANSISTORS

BACKGROUND OF THE INVENTION

1. Field of the Invention

This invention relates generally to a method for fabricating complementary NPN and PNP bipolar transistors on a single substrate, and more particularly, to a method of selective molecular beam epitaxy for fabricating complementary NPN and PNP heterojunction bipolar transistors on a single substrate.

2. Discussion of the Related Art

Different methods are known in the art for fabricating desirable NPN or PNP type semiconductor devices. When fabricating circuits which include both NPN and PNP bipolar transistors it is sometimes thought to be necessary to develop the transistors on separate substrates. It is known, however, to be extremely advantageous in many applications to develop complementary NPN and PNP bipolar transistors on the same substrate. Applicability for these complementary devices include, but are not limited to, push-pull power amplifiers and circuits incorporating active loads, both known to those skilled in the art. For a more in-depth discussion of the advantages of complementary NPN/PNP bipolar transistors over separate NPN and PNP transistors, see P.R. Gray and R.G. Meyer, "Analysis and Design of Analog Integrated Circuits", (John Wiley & Sons, New York, 1977). For semiconductor devices which are fabricated from silicon it is possible to produce bipolar NPN and PNP transistors into useful circuits on the same substrate with certain existing fabrication techniques, such as diffusion and ion implantation.

In view of present day frequency and speed requirements of bipolar transistors, a much more useful device would be a heterojunction bipolar (HBT) transistor i.e., bipolar transistors which include at least one PN junction of dissimilar materials generally comprised of GaAs/AlGaAs (gallium arsenide/aluminum gallium arsenide) or InGaAs/InAlAs/InP (indium gallium arsenide/indium aluminum arsenide/indium phosphide). Fabrication techniques applicable to complementary silicon NPN and PNP bipolar transistors are generally not adequate for these types of GaAs/AlGaAs and InGaAs/InAlAs/InP HBTs.

Molecular beam epitaxy is one of the most popular methods of producing semiconductor devices requiring high precision doping and thickness constraints. Whether it be silicon homojunctions or GaAs/AlGaAs or InGaAs/InAlAs/InP heterojunction transistor devices, it has been heretofore thought impossible to fabricate NPN and PNP transistors on the same substrate using molecular beam epitaxy which result in high quality devices. One method attempted in the art has been to fabricate either an NPN or PNP profile on a substrate and then coat the just formed profile with a layer of silicon dioxide. The silicon dioxide is then removed by an appropriate method from the area of the substrate on which the opposite NPN or PNP profile was to be grown. This procedure has met with limited success in that the silicon dioxide layer has allowed damage to the already grown NPN or PNP profile during the process of growing the other profile. Consequently, such a procedure has degraded the response characteristics of the final device.

A method of using metal organic vapor phase epitaxy (MOVPE) has been recently reported in the literature to develop a complementary HBT, see David B. Slater, Jr. et al. "Monolithic Integration of Complementary HBT's By Selected MOVPE", IEEE Electron Device Letters, Vol. 11, No. 4, April 1990. In that procedure, the first PNP or NPN profile is developed using the MOVPE process and then a silicon nitride mask is deposited over the profile. The silicon nitride mask is then selectively etched away so that the remaining NPN structure can be developed. Although this procedure has met with some success, the performance of the ultimate complementary HBT device is poor. In addition, the MOVPE process does not have the same parameter control as can be accomplished by molecular beam epitaxy.

What is needed then is a molecular beam epitaxy procedure capable of growing complementary NPN and PNP HBT devices on a common substrate. It is therefore an object of the present invention to provide such a method.

SUMMARY OF THE INVENTION

Disclosed is a method for producing complementary NPN and PNP heterojunction bipolar transistors on a common substrate by molecular beam epitaxy. According to one preferred embodiment of this epitaxial growth procedure, an NPN or PNP profile is first deposited onto an appropriate substrate. A silicon nitride layer is then deposited over the profile generally by an evaporation process to act as a masking material. A resist layer is next deposited on the silicon nitride masking material. A patterned masking layer is configured relative to the resist layer to form a desirable pattern. The resist layer is irradiated through the masking layer and etched, as is known in the art, such that areas on the substrate where the opposite HBT structures are to be fabricated dissolve away. The substrate is then again etched in the opened areas to expose a clean surface for appropriate epitaxial growth. Next, the silicon nitride masking material is densified by heating the substrate and grown profile layers in a vacuum. Then, the NPN or PNP complementary device profile is deposited by molecular beam epitaxy to form a high quality crystalline profile layer on the exposed substrate and a polycrystalline material on the silicon nitride masking film. A resist is then deposited over the profile layer just grown and an appropriate mask is configured relative to the resist layer. The polycrystalline layer is etched away, and consequently, two adjacent complementary NPN and PNP structures are formed on the same substrate.

To develop the HBT transistor circuits themselves, the structure just formed above is positioned in the appropriate chambers for further processing. In the following stages of fabrication the desirable emitter and base mesas are developed along with the appropriate ohmic contacts. According to a preferred embodiment of the present invention, the P-ohmic contacts are developed at the same time on the NPN and PNP profiles as are the N-ohmic contacts. The remaining layers are also deposited to form a workable solid state circuit having many desirable qualities.

Additional objects, advantages and features of the present invention will become apparent from the following description and appended claims, taken in conjunction with the accompanying drawings.

BRIEF DESCRIPTION OF THE DRAWINGS

FIGS. 1(A)-1(F) show the stages in fabricating the complementary NPN and PNP profiles on a single substrate;

FIG. 2 shows the doping concentration of the different layers of the NPN and PNP profiles of FIG. 1;

DETAILED DESCRIPTION OF THE PREFERRED EMBODIMENTS

Figure 3:
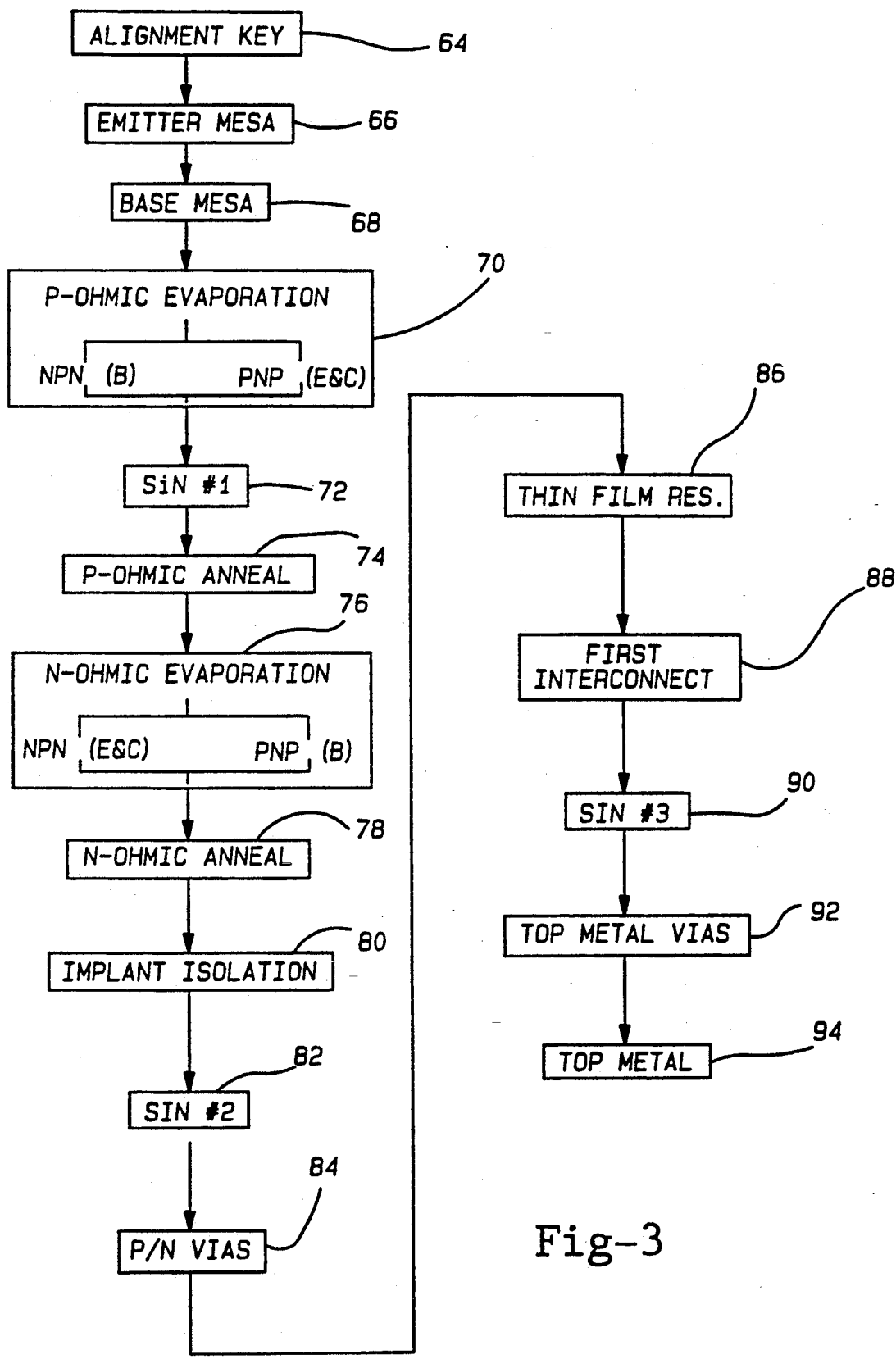
FIG. 3 shows in a block diagram flow chart the processing steps necessary to develop the HBT transistor circuits from the profiles of FIG. 2.

The following description of the preferred embodiments is merely exemplary in nature and is in no way intended to limit the invention or its application or uses.

First turning to FIG. 1, a method of fabricating complementary NPN and PNP type profiles on a common substrate is shown. In this illustration, reference numeral 10 represents the fabricated structure as it appears throughout different development stages according to one preferred embodiment of the present invention. It is noted that structure 10 will be positioned within an appropriate vacuum chamber (not shown) in each of the different fabrication stages shown in FIGS. 1(A)-1(F). Furthermore, the profiles discussed will be deposited by molecular beam epitaxy, the procedure of which is well known to those skilled in the art.

First viewing FIG. 1(A), a semi-insulating GaAs substrate 12 is shown. On substrate 12, a PNP profile 14 has been grown by molecular beam epitaxy to a desirable thickness. In FIG. 1, profile 14 (as well as profile 22 below) is shown as a single layer, however, it will be understood that this layer actually includes a series of accurately grown films, as will be described hereunder with reference to FIG. 2. In addition, the GaAs substrate 12 is used by way of example, and can equally be replaced with other appropriate substrates such as InP. Finally, PNP profile 14 is grown first because this profile will be used in a larger area than the NPN profile of the final device, and as such, it is more applicable to produce a higher quality device if the PNP profile is laid down before the NPN profile. It will be understood, therefore, that depositing an NPN profile first is within the scope of the invention.

FIG. 1(B) shows a silicon nitride layer 16 which has been deposited by a process such as plasma enhanced chemical vapor deposition on PNP profile 14 opposite to substrate 12. It is noted that silicon nitride is used by way of a non-limiting example in that other dielectric layers, such as silicon dioxide, may be equally applicable. Silicon nitride layer 16 will be used as a blocking layer to shield the grown PNP layers in areas where the PNP HBTs are to be fabricated. It should be noted that other methods of depositing silicon nitride layer 16 onto PNP profile 14 are within the scope of the present invention.

Next, a resist layer 18 is deposited by a well known process on the silicon nitride layer 16. Configured above layer 18 is a mask 20 which is used to establish a desirable pattern of PNP profile areas on substrate 12. Mask 20 is shown here at some appropriate distance above resist layer 18, but it is known to position mask 20 at other levels including on resist layer 18. Resist layer 18 is exposed to radiation through configured holes in mask 20 to expose certain areas on resist layer 18 to the radiation in order to establish the desirable PNP areas on the silicon nitride layer 16. The resist layer 18 is then developed by an appropriate solvent such that the resist areas exposed to the radiation are dissolved, but the unexposed resist areas are not dissolved. Next, an etchant solution is applied to the silicon nitride layer 16 to remove the silicon nitride in the areas which coincide with the dissolved region of the resist layer 18 in order to expose the PNP profile layer below. The view of FIG. 1(B) shows the structure 10 after the resist layer 18 has been etched to expose and remove the silicon nitride layer 16 as set forth by the pattern of mask 20.

In FIG. 1(C), the patterned silicon nitride layer 16 on PNP profile layer 14 is shown in which the area of substrate 12 on which the NPN profile will be grown has been cleared. Specifically, profile layer 14 and the corresponding silicon nitride layer 16 are etched by an appropriate solution, as discussed above, in areas where the complementary NPN profile layers are to be deposited. In addition, the remaining resist layer 18 has also been dissolved by an appropriate solution. The GaAs substrate 12 is then etched at the areas where exposed so that a clean surface is available for proper epitaxial growth. Further, the remaining silicon nitride masking layer 16 is densified by heating the entire structure 10 in a vacuum to approximately 350° C. This provides a clean, degassed and dense silicon nitride layer 16 before the structure 10 is re-introduced into the molecular beam epitaxial growth chamber.

Now turning to FIG. 1(D), it is shown that an NPN profile layer 22 has been grown by molecular beam epitaxy on the remaining silicon nitride layer 16 over the PNP profile 14 and the clean, etched portion of substrate 12, as shown. By this procedure, a high quality crystalline epitaxial film layer is formed on the clean areas of substrate 12 and a polycrystalline material is formed on the silicon nitride layer 16. The NPN profile layer 22 is then coated with a second resist layer 24 and an appropriate mask 26 is positioned as shown in FIG. 1(E) according to the desirable NPN pattern. Once the radiation step has been performed, the resist layer 24 is then accordingly dissolved, as discussed above for the PNP profile. FIG. 1(E) shows structure 10 after resist layer 24 has been irradiated through mask 26 and etched at the irradiated locations by the appropriate solution. Next, the polycrystalline portion of the NPN profile 22 is etched by the appropriate solution, as is the remaining resist layer 24, to form two adjacent regions of PNP profile 14 and NPN profile 22, as shown in FIG. 1(F).

FIG. 2 shows the different layers of the PNP profile 14 and the NPN profile 22 having been grown by molecular beam epitaxy as depicted in FIG. 1(F). In this Figure, the NPN and PNP profiles have been reversed to that of FIG. 1(E) in that the PNP profile 14 is on the right side and the NPN profile 22 is on the left side. The heterojunction NPN and PNP profiles themselves are known in the art, and therefore, their operation need not be elaborated on here. More particularly, however, the PNP profile 14 includes a first P-type GaAs contact layer 32 having a thickness of approximately 6000 angstroms and being doped with beryllium dopant atoms to approximately $6 \times 10^{18}$ atoms/cm$^{-3}$. Formed on top of GaAs contact layer 32 is a P-type GaAs collector layer 34 having a thickness of approximately 7000 angstroms and being lightly doped with beryllium dopant atoms to approximately $7 \times 10^{15}$ atoms/cm$^{-3}$. Formed on top of the GaAs collector layer 34 is an N-type GaAs base layer 36 having a thickness of approximately 1400 angstroms and being doped with silicon dopant atoms to approximately $6 \times 10^{18}$ atoms/cm$^{-3}$. Formed on top of base layer 36 is a P-type AlGaAs emitter layer 40 having a thickness of approximately 1800 angstroms and being doped with beryllium dopant atoms to approximately $5 \times 10^{17}$ atoms/cm$^{-3}$. Formed on top of emitter layer 40 is a P-type GaAs contact layer 42 having a thickness of approximately 750 angstroms and being heavily doped with beryllium dopant atoms to approximately $1 \times 10^{19}$ atoms/cm$^{-3}$. Regions 38 and 44 represent areas of layer 40 in which the doping is graded to meet the doping of the adjacent layers 36 and 44, respectively. Regions 38 and 44 have a thickness of approximately 300 angstroms each such that the remaining region of layer 40 is approximately 1200 angstroms.

Now focusing on the NPN region 22, it is shown that an N-type GaAs contact layer 46 is first grown on substrate 12 adjacent region 14. Contact layer 46 is approximately 6000 angstroms thick and is doped with silicon atoms to approximately $6 \times 10^{18}$ atoms/cm$^{-3}$. Formed on top of contact layer 46 is an N-type GaAs collector layer 48 having a thickness of approximately 7000 angstroms and being lightly doped with silicon atoms to approximately $7 \times 10^{15}$ atoms/cm$^{-3}$. Grown on top of collector layer 48 is a P-type GaAs base layer 50 having a thickness of approximately 1400 angstroms and being heavily doped with beryllium atoms to approximately $1 \times 10^{19}$ atoms/cm$^{-3}$. Grown on top of base layer 50 is an N-type AlGaAs emitter layer 54 having a thickness of approximately 1800 angstroms and being doped with silicon atoms to approximately $5 \times 10^{17}$ atoms/cm$^{-3}$. The top layer is an N-type contact layer 58 having a thickness of approximately 750 angstroms and being doped with silicon atoms at approximately $6 \times 10^{18}$ atoms/cm$^{-3}$. Regions 52 and 56 represent areas of layer 54 in which the doping is graded to meet the doping of the adjacent layers 50 and 58, respectively. Regions 52 and 56 have a thickness of approximately 300 angstroms each, such that the remaining region of layer 54 is approximately 1200 angstroms. Once the NPN and PNP profiles as shown in FIG. 2 have been developed by the process as discussed above in FIG. 1, it is then necessary to develop the two profiles into final desirable components. In this example, as discussed above, the NPN and PNP profiles will be developed into heterojunction bipolar transistors.

Turning to FIG. 3, a process for further developing the circuit incorporating both of the NPN and PNP type heterojunction bipolar transistors simultaneously from the profiles in FIG. 2 is shown in a flow chart form. The first step of developing the structure 10 as shown in FIG. 2 into a desirably configured complementary array of heterojunction bipolar transistors (as well as support devices) involves the step designated by box 64 as aligning the structure 10 in an appropriate machine for etching the emitter mesas and base mesa of both the PNP and NPN HBTs as depicted by the steps of boxes 66 and 68. The steps of etching the emitter and base mesas involves the process of using resists and appropriately configured masks, as is known in the art.

The next step represented by box 70 is one of the critical steps of the formation of the complementary heterojunction bipolar transistors which enables them to be developed simultaneously in a common process. More particularly, box 70 is a P-type ohmic evaporation step in which ohmic contact layers are configured on a P-type material for both NPN and PNP profiles by an appropriate evaporation process in a single step. This step involves the use of resist layers and masks to pattern the desirable evaporation. In the NPN transistor it is the P-type base which gets the P-ohmic contact and in the PNP transistor it is the emitter and collector which get the P-ohmic contact. In a preferred embodiment, the P-ohmic contacts are a gold-beryllium composite which are formed at the desirable location on the developing NPN and PNP profiles by an electron beam evaporation process well known to those skilled in the art.

Box 72 represents a first silicon nitride deposition process which forms a dielectric layer over the developing NPN and PNP profiles for providing the dielectric for certain resistor and capacitor components, and also providing a protection layer to the structure being developed. Box 74 represents a P-type ohmic anneal process following the first silicon nitride deposition step in which the wafer is heated in an appropriate chamber and allowed to cool in order to provide the desirable ohmic contacts.

Box 76 represents the N-type ohmic evaporation step for developing the ohmic contacts on the N-type material of both the NPN and PNP type profiles. In the NPN type profile it is the emitter and collector which gets the N-ohmic contact and in the PNP profile it is the base which gets the N-ohmic contact. The process is by an electron beam evaporation of a gold-germanium composite. The gold-germanium contacts just deposited are then heated and selectively cooled to provide the annealing of the contact layers as represented by the step of box 78.

Next, an implant isolation process is performed as represented by the step of box 80 in order to further define certain transistor areas of the NPN and PNP profiles. The implant isolation step 80 generally involves implanting boron at selective energy levels in order to damage the GaAs of the profiles and thus separate certain transistor areas. This implant isolation reduces the size of the transistors in order to reduce the capacitance and increase the speed of the transistors.

A second silicon nitride layer is then deposited by an appropriate evaporation method as depicted by the step of box 82. This silicon nitride layer is a passivation layer for insulating the layers below it. An etching process is then performed in order to open selective holes in the second silicon nitride layer just deposited in order to make contact with a thin film resistor layer which is later deposited as depicted by the step of box 86. The thin film resistor layer is formed by an appropriate resist and sputtering process to form desirable resistive contacts with the transistor circuits being developed depending on the application in which they are to be used. A contact layer is next deposited in the holes formed by the step of box 86 by a vapor deposition process as represented by the interconnect step of box 88. This provides contact between the resistor layer and the desirable contacts of the transistors.

Next, a third silicon nitride insulating layer is deposited on top of the contact layer of step 88 as depicted by the step of box 90 such that the thin film resistor laid down in the step of box 88 is sandwiched between two insulating layers, one by the silicon nitride deposition layer of the step of box 82 and the other by the silicon deposition layer of the step of box 90, to form the desirable circuitry. The third silicon nitride layer is also a passivation layer to protect the underlying circuit.

Next, holes are opened through the third silicon nitride insulating layer as represented by the step of box 92, in a masking and etching process well known to those skilled in the art, in order to make appropriate contact to a top metal contact layer which is formed to the top of the circuit as depicted by the step of box 94. Once the steps above are performed on the PNP and NPN profiles developed in FIG. 1, a workable complementary heterojunction bipolar transistor combination circuit has been developed for a specific application.

Figure 4A:
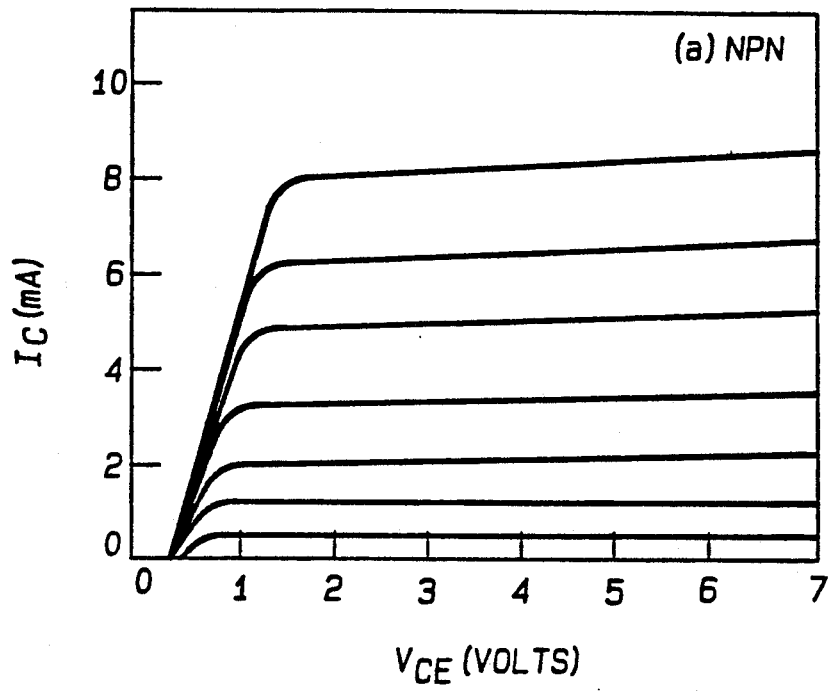
FIGS. 4(A)-4(B) show the I-V characteristics of the NPN and PNP HBT complementary transistors developed by the processes above.
Figure 4B:
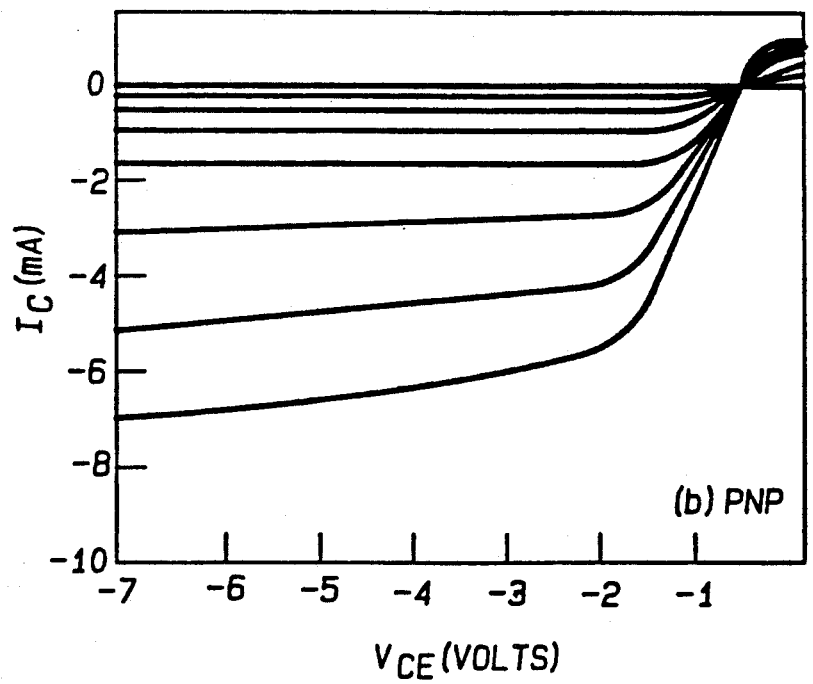

The process described above produces a complementary heterojunction bipolar transistors having exceptionally good performance for both DC and microwave performance. FIG. 4 exhibits common current-voltage (I-V) emitter characteristics for typical heterojunction bipolar transistor devices having an emitter area of approximately 30 $\mu$m developed by the above process. More particularly, the I-V curves of FIG. 4(A) is of the NPN type heterojunction bipolar transistors and the I-V curves of FIG. 4(B) is of the PNP type heterojunction bipolar transistors. As is apparent, both of these devices exhibit good DC characteristics having good bulk and contact resistances. The NPN curves have 25 $\mu$A step sizes starting with a 10 $\mu$A base current. The PNP curves have 75 $\mu$A step sizes, starting with a $-10$ $\mu$A base current. In addition, the common emitter gains for this example were typically 50-60 for the NPN HBT and 6-10 for the PNP HBT.

Figure 5:
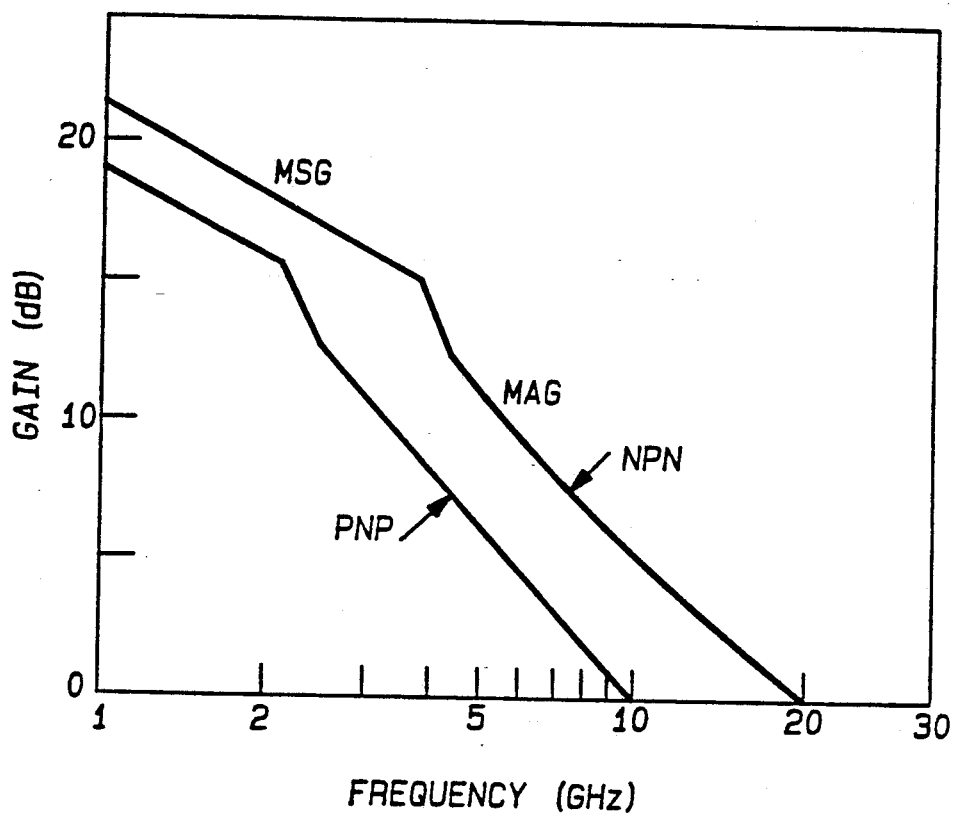
FIG. 5 shows the S-parameters of the frequency versus gain curve of the PNP and NPN transistors.

Now turning to FIG. 5, S-parameter (scattering parameter) measurements are depicted as a graph of frequency versus gain from 1-26 GHz. More particularly, the maximum stable gain (MSG) and maximum available gain (MAG) are shown as a function of frequency for the complementary HBT devices. This frequency response is for complementary NPN and PNP devices having a 30 $\mu m^2$ emitter area. Both the DC and microwave results match closely to those obtained from the devices produced using conventional molecular beam epitaxy on separate wafers, thus indicating that the additional growth and process steps required to fabricate these devices did not adversely affect the performance of the devices.

The foregoing discussion discloses and describes merely exemplary embodiments of the present invention. Other applications include the integration of high electron mobility transistors (HEMT) and HBTs, lasers and HBTs, etc. on the same wafer. One skilled in the art will readily recognize from such discussion, and from the accompanying drawings and claims, that various changes, modifications and variations can be made therein without departing from the spirit and scope of the invention as defined in the following claims.

What is claimed is:

1. A method of producing a desirable configuration of transistor devices on a common substrate, said method comprising the steps of:

fabricating NPN and PNP profiles adjacent to each other on the substrate, the NPN and PNP profiles each including at least an emitter region, a base region, and a collector region;

developing emitter mesas and base mesas on each NPN and PNP profile;

simultaneously evaporating P-ohmic contacts on the base regions of the NPN profiles and the emitter and collector regions of the PNP profiles;

annealing the P-ohmic contacts;

simultaneously evaporating N-ohmic contacts on the emitter and collector regions of the NPN profiles and base regions of the PNP profile; and annealing the N-ohmic contacts.

2. The method according to claim 1 wherein the method of producing a desirable configuration of transistor devices is a method of producing a desirable configuration of heterojunction bipolar transistor devices.

3. The method according to claim 1 wherein the step of fabricating NPN and PNP profiles includes the step of fabricating the NPN and PNP profiles by means of molecular beam epitaxy.

4. The method according to claim 1 wherein the steps evaporating P-ohmic contacts and N-ohmic contacts includes evaporating gold-beryllium contacts by means of electron beam evaporation.

5. The method according to claim 1 further comprising the step of depositing a dielectric layer after the step of evaporating the P-ohmic contacts, but prior to the step of annealing the P-ohmic contacts.

6. The method according to claim 1 further comprising the steps of depositing subsequent layers including dielectric layers, a thin film resistance layer and associated contact layers to provide the desirable configuration of transistor devices.

* * * * *